United States Patent
Jang et al.

(10) Patent No.: US 7,863,121 B2
(45) Date of Patent: Jan. 4, 2011

(54) METHOD FOR FABRICATING SCHOTTKY BARRIER TUNNEL TRANSISTOR

(75) Inventors: Moon-Gyu Jang, Daejon (KR); Yark-Yeon Kim, Daejon (KR); Chel-Jong Choi, Daejon (KR); Myung-Sim Jun, Daejon (KR); Tae-Youb Kim, Seoul (KR); Seong-Jae Lee, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 79 days.

(21) Appl. No.: 11/800,914

(22) Filed: May 8, 2007

(65) Prior Publication Data

US 2008/0121868 A1 May 29, 2008

(30) Foreign Application Priority Data

Nov. 29, 2006 (KR) ...................... 10-2006-0118986

(51) Int. Cl.
*H01L 21/338* (2006.01)
(52) U.S. Cl. ............................... 438/167; 257/E29.148
(58) Field of Classification Search .................. 438/142, 438/186, 167, 184; 257/E29.148, E21.164
See application file for complete search history.

(56) References Cited

U.S. PATENT DOCUMENTS

| | | | | |
|---|---|---|---|---|
| 4,855,246 A | * | 8/1989 | Codella et al. | 438/185 |
| 5,512,499 A | * | 4/1996 | Cambou et al. | 438/179 |
| 6,271,133 B1 | * | 8/2001 | Lim et al. | 438/683 |
| 6,339,005 B1 | * | 1/2002 | Bryant et al. | 438/307 |
| 6,974,737 B2 | * | 12/2005 | Snyder et al. | 438/199 |
| 7,183,573 B2 | * | 2/2007 | Bryant et al. | 257/66 |
| 2001/0024847 A1 | * | 9/2001 | Snyder | 438/197 |
| 2003/0139002 A1 | | 7/2003 | Snyder | |
| 2005/0133866 A1 | * | 6/2005 | Chau et al. | 257/348 |
| 2005/0151166 A1 | * | 7/2005 | Lin et al. | 257/204 |

FOREIGN PATENT DOCUMENTS

| | | |
|---|---|---|
| KR | 1020000025576 A | 5/2000 |
| KR | 10-2004-0015417 | 2/2004 |
| KR | 10-0560432 | 3/2006 |

OTHER PUBLICATIONS

L.E. Calvet et al., "Supression of leakage current in Schottky barrier metal-oxide-semiconductor field-effect transistors", Journal of Applied Physics, vol. 91, No. 2, Jan. 15, 2002, 2002 American Institute of Physics (pp. 757-759).

* cited by examiner

*Primary Examiner*—Sue Purvis
*Assistant Examiner*—Selim Ahmed
(74) *Attorney, Agent, or Firm*—Blakely, Sokoloff, Taylor & Zafman LLP

(57) ABSTRACT

A Schottky barrier tunnel transistor includes a gate electrode, and source and drain regions. The gate electrode is formed over a channel region of a substrate to form a Schottky junction with the substrate. The source and drain regions are formed in the substrate exposed on both sides of the gate electrode.

11 Claims, 3 Drawing Sheets

METHOD FOR FABRICATING SCHOTTKY BARRIER TUNNEL TRANSISTOR

CROSS-REFERENCES TO RELATED APPLICATIONS

The present invention claims priority of Korean patent application number 10-2006-0118986 filed on Nov. 29, 2006, which is incorporated by reference in its entirety.

BACKGROUND OF THE INVENTION

The present invention relates to a semiconductor device and a method for fabricating the same, more particularly, to a Schottky barrier tunnel transistor and a method for fabricating the same.

Advancement in semiconductor technology and equipment leads to fabrication of transistors with a short channel of 100 nanometers (nm) or less. Devices following the typical simple electrical physical laws accompany quantum mechanical phenomena. A single electron transistor (SET) is one representative example for such devices.

A conventional structure of the SET usually uses a barrier that is generated by forming a pattern in an artificial shape over a silicon-based structure using a difference in an oxidation rate relying on a pattern. This characteristic may worsen an operational characteristic of a device in view of the Moore's law.

In a transistor with a channel length less than 100 nm, leakage current is likely to occur due to a short channel effect. Thus, an appropriate control is generally required. In an attempt to suppress the short channel effect, the junction depth of a source and a drain needs to be in a range of ⅓ to ¼ of the channel length. Although many researchers put an effect to form a shallow junction with low accelerating voltage while continuously using an ion implantation, implemented typically in semiconductor fabrication processes, it is often difficult to control the junction depth of the source and the drain to be shallow and uniform below 30 nm. Thus, one suggested method is to diffuse impurity ions using a rapid thermal process (RTP), a laser annealing process, or a solid phase diffusion (SPD) process. However, this impurity ion diffusion method may be limited to obtain a junction depth of 10 nm or less. Furthermore, as the junction depth decreases, parasitic resistance components of the source and drain including a source-drain extension region caused by the diffusion of the impurity ions increase. Based on this relationship, in the assumption that a doping concentration is $1 \times 10^{19}$ atoms/cm$^3$ and a junction depth is 10 nm, a sheet resistance is 500 ohms ($\Omega$)/sq. or more. This value exceeds a sheet resistance of about 300 ($\Omega$)/sq. proposed by the international technology roadmap for semiconductor (ITRS), and may cause a limitation such as signal delay.

In addition to the implementation of the shallow junction depth of the source and drain, permittivity of a gate insulation layer (e.g., oxide) needs to increase to suppress the short channel effect. Many researches have been done to replace a silicon oxide layer, which is typically used in these days, with an oxide layer containing a rare earth metal of a high dielectric constant. However, as compared with the silicon oxide layer, the rare earth metal-based oxide layer may not be effectively heat treated due to its thermal instability. Therefore, a heat treatment in semiconductor processes needs to be performed at low temperature to use such a rare earth metal-based oxide layer. In that case, a heat treatment that proceeds after the ion implantation to activate ions and recover crystal damage may be performed with some limitations.

For the minimization of metal oxide semiconductor field effect transistors (MOSFETs), those limitations associated with a gate oxide material and shallow junctions between source-drain regions and channels need to be overcome in respect of the short channel effect. One proposed approach is Schottky barrier tunnel transistor (SBTT) technology. In detail, source and drain regions of MOSFETs are replaced with a metal or silicide. As compared with the conventional MOSFETs, the sheet resistance measured when the SBTT technology is employed decreases by ⅒-fold to ¹⁄₅₀-fold. Thus, an operation speed can be improved, and a channel length can decrease to 35 nm or less. Also, since an ion implantation is not necessary, a subsequent heat treatment is also not necessary. As a result, a process for fabricating devices using a gate oxide layer based on a high-K dielectric material can be co-used in the SBTT technology. As compared with the conventional MOSFET technology, even though the subsequent heat treatment is implemented, the heat treatment is performed at low temperature. Thus, a process of forming gates based on a metal can be co-used in the SBTT technology.

FIG. 1 illustrates a cross-sectional view of a conventional SBTT structure. The SBTT includes: a substrate 10; a buried oxide layer 11 formed on the substrate 10; source and drain regions 12 formed inside a silicon-on-insulator (SOI) substrate, which is formed on the buried oxide layer 11; a gate insulation layer 13 formed on a channel region 16 of the SOI substrate; a gate electrode 14 formed on the gate insulation layer 13; and spacers 15 formed on both sidewalls of the gate electrode 14.

The conventional SBTT is formed to have a vertical structure in which the gate insulation layer 13 and the gate electrode 14 are formed in sequence on the SOI substrate. The conventional SBTT structure is similar to the conventional MOSFET structure. Different from the conventional MOSFET fabrication process, the source and drain regions 12 in the SBTT structure are not formed by the ion implantation but usually by a sputtering method. Based on the sputtering method, a thin metal film is first deposited, and heat treated to form a silicide layer.

However, since the conventional SBTT has a structure in which the gate insulation layer is interposed underneath the gate electrode, in consideration of the short channel effect, the gate insulation layer may be formed of a high-K dielectric material-based thin film, or the thickness of the gate insulate layer needs to be reduced. In the case of using polysilicon as a gate electrode material, an effective oxide thickness increases due to a depletion effect observed between the gate electrode and the gate insulation layer. In particular, the conventional SBTT technology may have a difficulty in satisfying a required effective oxide thickness of 1.5 nm or less in a device with a line width of 50 nm or less. Also, among high-K dielectric thin films, it may still be difficult to develop a thin film that can have a stable effective insulation thickness of 2 nm or less.

SUMMARY OF THE INVENTION

Specific embodiments of the present invention are directed toward providing a Schottky barrier tunnel transistor capable of suppressing a short channel effect with a simple structure.

Specific embodiments of the present invention are directed toward providing a method for fabricating a Schottky barrier tunnel transistor through a simplified process.

In accordance with one aspect of the present invention, there is provided a Schottky barrier tunnel transistor. The Schottky barrier tunnel transistor includes a gate electrode formed over a channel region of a substrate to form a Schottky junction with the substrate, and source and drain regions formed in the substrate exposed on both sides of the gate electrode.

In accordance with another embodiment of the present invention, there is provided a method for fabricating a Schottky barrier tunnel transistor. The method includes forming a gate electrode over a channel region of a substrate, the gate electrode providing a Schottky junction with the substrate, forming spacers over sidewalls of the gate electrode, and forming source and drain regions in the substrate exposed on both sides of the spacers.

DESCRIPTION OF SPECIFIC EMBODIMENTS

Figure 1:
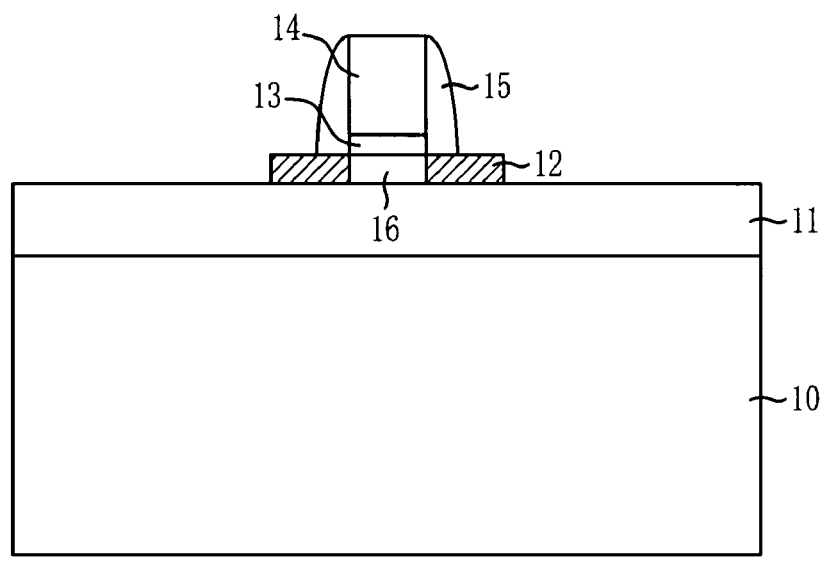
FIG. 1 illustrates a cross-sectional view of a conventional Schottky barrier tunnel transistor (SBTT).
Figure 2:
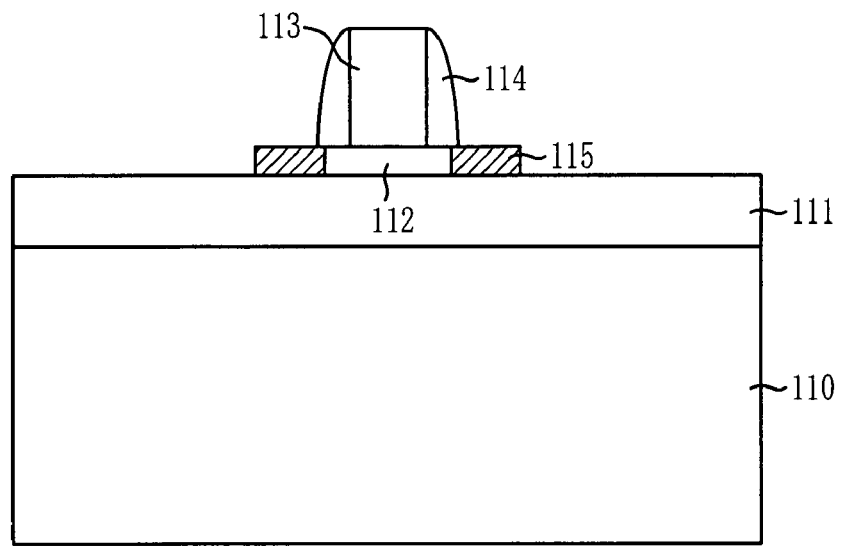
FIG. 2 illustrates a cross-sectional view of a SBTT in accordance with an embodiment of the present invention.

FIG. 2 illustrates a cross-sectional view of a Schottky barrier tunnel transistor (SBTT) in accordance with an embodiment of the present invention. In the following drawings, the thickness of layers and regions are exaggerated for clarity of the description, and when it is described that one layer is formed on another layer or a substrate, the term "on" indicates that the layer may be formed directly on the other layer or the substrate, or a third layer may be interposed therebetween.

The SBTT includes a silicon-based substrate 112, a gate electrode 113, and source and drain regions 115. The gate electrode 113 is formed over a channel region of the silicon-based substrate 112, so as to form a Schottky junction with the silicon-based substrate 112. The source and drain regions 115 are formed inside the silicon-based substrate 112 exposed on both sides of the gate electrode 113, and include silicide.

The silicon-based substrate 112 includes the channel region, and may be a silicon-on-insulator (SOI) substrate or a bulk substrate, which has a low unit cost. For instance, in the case of fabricating a P-type device in which holes function as carriers, the silicon-based substrate 112 is doped with a P-type impurity ion including a group III element such as boron (B). In the case of fabricating an N-type device in which electrons function as carriers, the silicon-based substrate 112 is doped with an N-type impurity ion including a group V element such as phosphorus (P) or arsenic (As). A concentration of such an impurity ion is low being about $10^{17}$ atoms/cm$^3$ or less. The silicon-based substrate 112 is formed as thin as possible. For instance, a thickness of the silicon-based substrate 112 may be about 100 nm or less. More specifically, the silicon-based substrate 112 is formed to a thickness that allows control of an electric field that a gate controls. Thus, the thickness of the channel region that the gate controls decreases, so that formation of an inversion layer can be easily controlled. As a result, leakage current usually generated between the source and drain regions 115 can be reduced.

The gate electrode 113 directly contacts the channel region, thereby forming a Schottky junction with the silicon-based substrate 112. The gate electrode 113 may include a metal-based layer or a metal silicide-based layer, which is a conjugate material between a metal and silicon. For example, the metal-based layer may include a transition metal or rare earth metal. The transition metal may include one selected from a group consisting of iron (Fe), cobalt (Co), tungsten (W), nickel (Ni), palladium (Pd), platinum (Pt), molybdenum (Mo), and titanium (Ti). The rare earth metal may include one selected from a group consisting of erbium (Er), ytterbium (Yb), samarium (Sm), yttrium (Y), lanthanum (La), cerium (Ce), terbium (Tb), dysprosium (Dy), holmium (Ho), thulium (Tm), and lutetium (Lu).

As similar to the gate electrode 113, the source and drain regions 115 may include a metal-based layer or a metal silicide-based layer. The metal-based layer may include a transition metal or a rare earth metal, and the metal silicide-based layer may include a conjugate material between a metal and silicon. More specifically, the source and drain regions 115 include metal silicide, which is a conjugate material between a rare earth metal and silicon.

A method for fabricating the SBTT illustrated in FIG. 2 will be described in detail. FIGS. 3A to 3D are cross-sectional views illustrating the SBTT fabrication method in accordance with an embodiment of the present invention.

Figure 3A:
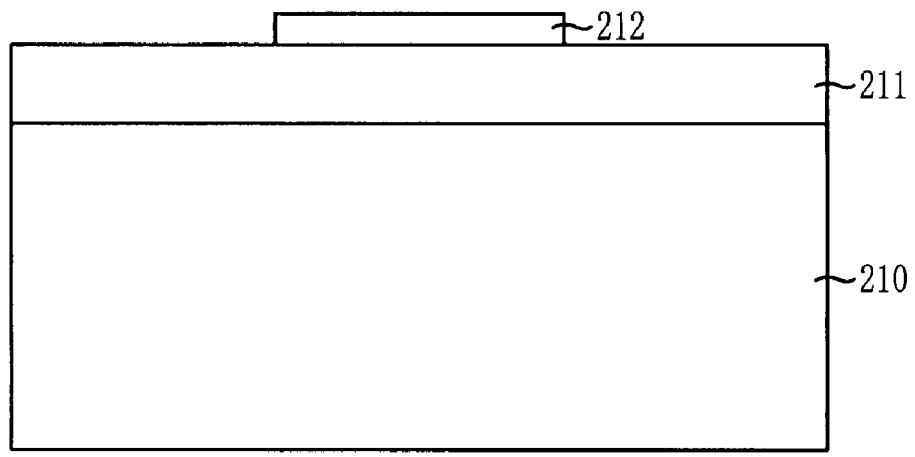
FIGS. 3A to 3D are cross-sectional views illustrating a method for fabricating a SBTT in accordance with an embodiment of the present invention.

Referring to FIG. 3A, a SOI substrate includes a support substrate 210, a buried oxide layer 211, and a silicon-based substrate 212. Instead of the SOI substrate, a bulk substrate may be used. An ion implantation for forming a well and another ion implantation for adjusting a threshold voltage are performed. For instance, for the ion implantation for forming the well, when a P-type device is to be fabricated, the silicon-based substrate 212 is doped with a P-type impurity ion such as boron. On the other hand, when an N-type device is to be fabricated, the silicon-based substrate 212 is doped with an N-type impurity ion such as phosphorus or arsenic, which is a group V element. A concentration of the impurity ion doped into the silicon-based substrate 212 is low being about $10^{17}$ atoms/cm$^3$ or less.

Prior to or after performing the ion implantation for forming the well, the silicon-based substrate 212 is dry etched such that a certain portion of the silicon-based substrate 212 remains over the buried oxide layer 211. One remaining portion of the silicon-based substrate 212 becomes a channel region, and another remaining portion thereof becomes source and drain regions 215 (see FIG. 3D).

Figure 3B:
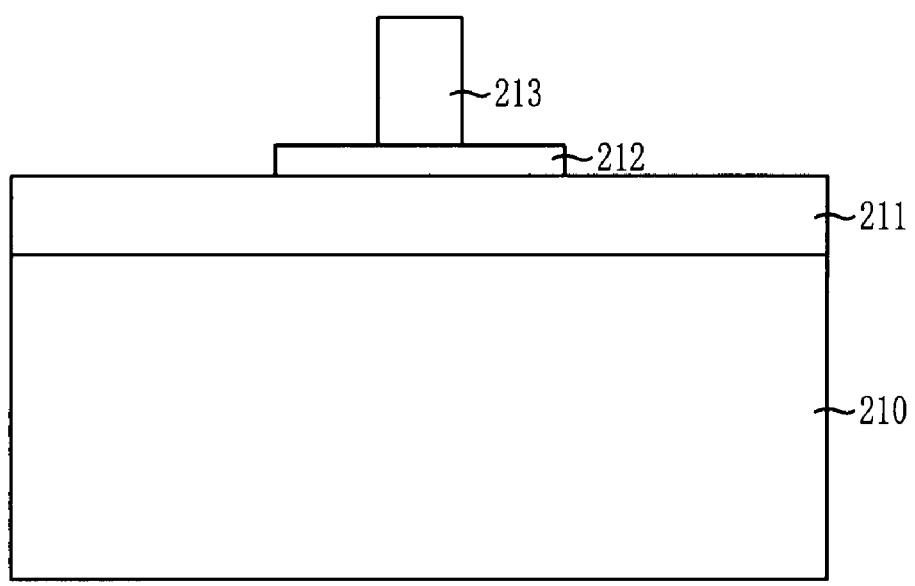

Referring to FIG. 3B, a gate electrode 213 is formed over a channel region of the silicon-based substrate 212. The gate electrode 213 includes a metal-based layer or a metal silicide-based layer, which is formed of a conjugate material of a metal and silicon. For instance, the metal-based layer may include a transition metal or a rare earth metal. The transition metal may include one selected from a group consisting of Fe, Co, W, Ni, Pd, Pt, Mo, and Ti. The rare earth metal may include one selected from a group consisting of Er, Yb, Sm, Y, La, Ce, Tb, Dy, Ho, Tm, and Lu.

In the case of fabricating an N-type device, the gate electrode 213 may include Pt, which provides a high Schottky barrier to electrons, or platinum silicide. In the case of fabricating a P-type device, the gate electrode 213 may include erbium silicide, which provides a high Schottky barrier to holes.

A method of forming the gate electrode 213 based on a metal or silicide will be described in detail. First, among various possible metals, the case of using Pt as the gate electrode 213 will be described. A layer of Pt is formed over the silicon-based substrate 212, and a buffer layer and a hard mask layer are formed over the Pt layer. The buffer layer and the hard mask layer include an oxide-based material and a nitride-based material, respectively. The hard mask layer, the buffer layer, and the Pt layer are etched using an etch mask. As a result, the gate electrode 213 having the profile as illustrated in FIG. 3B is formed over the channel region of the silicon-based substrate 212.

Among various possible metal silicide-based materials, a method of forming the gate electrode 213 based on platinum silicide will be described. A layer of Pt is formed over the silicon-based substrate 212, and etched using an etch mask to make a portion of the Pt layer remain over the channel region of the silicon-based substrate 212. A resultant structure is then heat treated to allow a reaction between Pt from the Pt layer and silicon from the silicon-based substrate 212, so as to produce platinum silicide. A portion of the Pt layer that does not react with the silicon is removed. As a result, the gate electrode 213 is formed over the channel region.

Figure 3C:
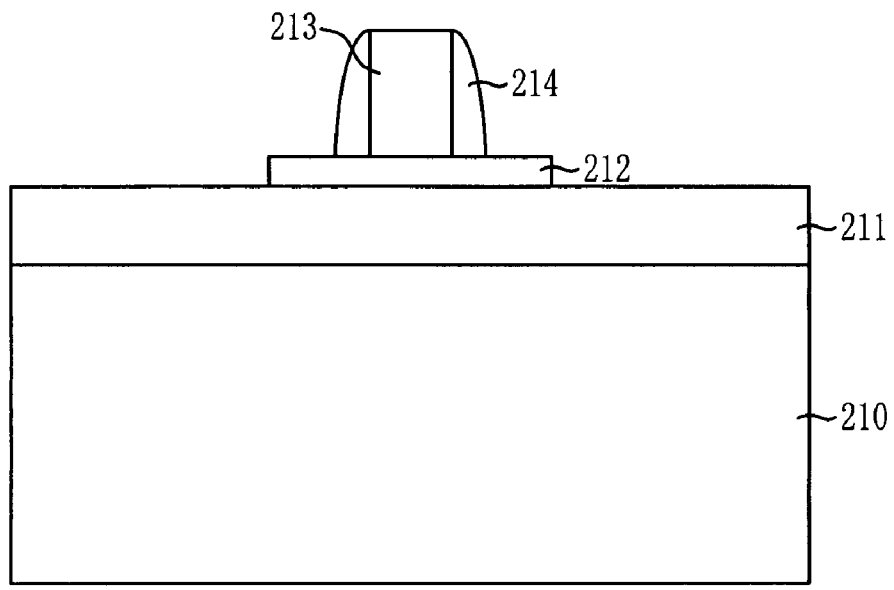

Referring to FIG. 3C, although not illustrated, an insulation layer for use in a spacer is formed over a resultant surface profile of the gate electrode 213 and the silicon-based substrate 212. An etch-back treatment such as a dry etching is performed on the insulation layer to form spacers 214 on both sidewalls of the gate electrode 213. The spacers 214 are formed to prevent an electric short circuit event between the gate electrode 213 and the subsequent source and drain regions 215. Any insulation material may be used for the spacers 214. For instance, an oxide-based material, a nitride-based material, or a stack structure thereof may be used for the spacer material.

Figure 3D:
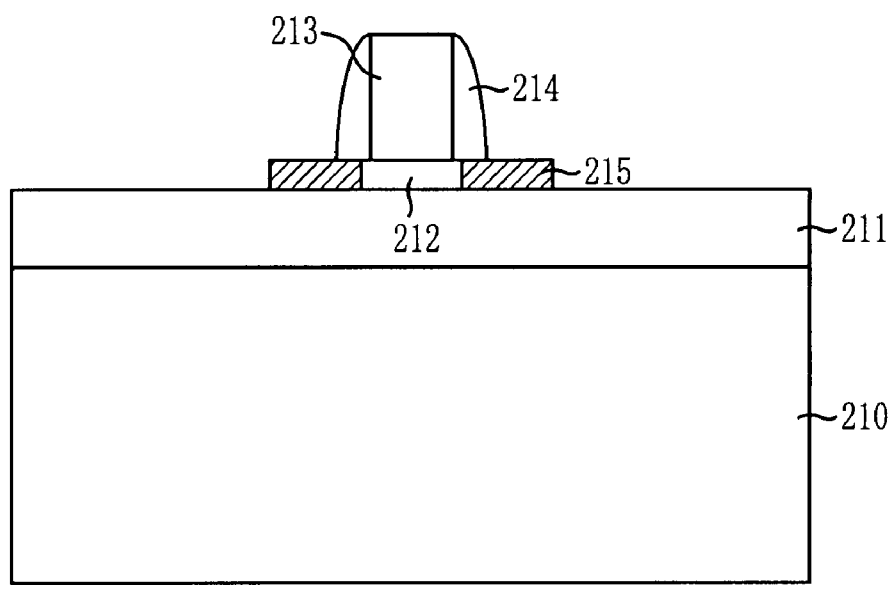

Referring to FIG. 3D, the aforementioned source and drain regions 215 are formed in the silicon-based substrate 212 exposed by the spacers 214. The source and drain regions 215 may include a conjugate material between a transition or rare earth metal and silicon. For instance, the source and drain regions 215 are formed as follows. A metal-based layer is formed over a resultant surface profile of the spacers 214 and the silicon-based substrate 212, and heat treated to react with silicon from a region where the source and drain regions 215 are to be formed. As a result, a silicide layer that is self-aligned by the spacers is formed.

In more detail of the formation of the source and drain regions 215, a layer including a transition or rare earth metal is formed over the resultant surface profile of the spacers 214 and the silicon-based substrate 212, and a rapid thermal annealing (RTA) treatment is performed thereon. The thickness of the above metal-based layer, reaction temperature, and time are adjusted to allow the silicide reaction to proceed until a bottom portion of the source and drain regions 215 reach an upper portion of the buried oxide layer 211. A portion of the metal-based layer that does not react with the silicon is removed by a cleaning treatment. For instance, a sputtering method is performed inside a chamber using argon (Ar), or the resultant structure including the metal-based layer is cleaned by being dipped into a solution of hydrogen fluoride (HF).

In the case of fabricating an N-type device, the source and drain regions 215 may include a rare earth metal-based material having a high Schottky barrier to electrons. The rare earth metal-based material may include erbium silicide. In the case of fabricating a P-type device, the source and drain regions 215 may include Pt having a low Schottky barrier to holes or platinum silicide.

For instance, in the case of using erbium silicide as the source and drain regions 215, an Er layer is formed over the resultant surface profile, and heat treated at about 500° C. to about 600° C. to make Er from the Er layer react with silicon from the silicon-based substrate 212. As a result of this reaction, an erbium silicide layer is formed. In the case of forming the source and drain regions 215 based on platinum silicide, a Pt layer is formed over the resultant surface profile, and heat treated at about 400° C. to 600° C. to allow a reaction between silicon and Pt, so as to form a platinum silicide layer.

According to various embodiments of the present invention, silicide-based Schottky junctions formed as the gate electrode and the source and drain regions. These embodiments illustrate one approach to overcome a decrease in saturation current, usually caused by parasitic resistance generated when shallow junctions (e.g., source and drain regions) are formed, and a difficulty in thinly forming a gate insulation layer, both usually observed in minimizing MOSFETs based on the conventional technology. Furthermore, a SBTT can be fabricated using the conventional MOSFET fabrication equipment, and thus, manufacturing costs can be reduced. As compared with the conventional technology, the embodied SBTT technology allows skipping of several processes (e.g., process of forming gate insulation layer), and thus, a simplified fabrication processes can be achieved. Since the embodied SBTT structure and fabrication method follow an operational principle based on the quantum mechanical physical law, the embodied method can be easily applied in various fields.

While the present invention has been described with respect to specific embodiments, it will be apparent to those skilled in the art that various changes and modifications may be made without departing from the spirit and scope of the invention as defined in the following claims.

What is claimed is:

1. A method for fabricating a Schottky barrier tunnel transistor, the method comprising:
    forming a gate electrode with a layer of a first rare earth metal over a channel region of a substrate, the gate electrode providing a Schottky junction with the substrate;
    forming spacers over sidewalls of the gate electrode; and
    forming a layer of a second rare earth metal over the spacers and the substrate to produce source and drain regions in the substrate exposed on both sides of the spacers,
    wherein the first rare earth metal and the second rare earth metal is selected from a group consisting of: erbium (Er), ytterbium (Yb), samarium (Sm), yttrium (Y), lanthanum (La), cerium (Ce), terbium (Tb), dysprosium (Dy), holmium (Ho), thulium (Tm), and lutetium (Lu).

2. The method of claim 1, wherein forming the gate electrode comprises:
    forming the first metal-based layer over the substrate; and
    etching the first metal-based layer to make a portion of the metal-based layer remain over the channel region.

3. The method of claim 2, further comprising, after etching the first metal-based layer, performing a heat treatment to form a metal silicide-based layer through a reaction between the remaining portion of the first metal-based layer and the substrate.

4. The method of claim 3, further comprising, after performing the heat treatment to form the metal silicide-based layer, removing a portion of the remaining metal-based layer not reacting with the substrate.

5. The method of claim 1, wherein forming the source and drain regions comprises:
    forming the second metal-based layer over the substrate and the spacers; and
    performing a heat treatment to form a metal silicide layer through a reaction between the metal-based layer and the substrate.

6. The method of claim 5, further comprising, after performing the heat treatment to form the metal silicide-based layer, removing a portion of the metal-based layer not reacting with the substrate.

7. The method of claim 1, wherein the substrate comprises one of a silicon-on-insulator substrate and a bulk substrate.

8. The method of claim 7, wherein the silicon-on-insulator substrate comprises:
   a support substrate used to provide a mechanical support;
   a buried oxide layer formed over the support substrate; and
   a silicon layer formed over the buried oxide layer.

9. The method of claim 8, wherein forming the source and drain regions comprises forming the source and drain regions such that a bottom portion of the source and drain regions contacts an upper portion of the buried oxide layer.

10. A method for fabricating a Schottky barrier tunnel transistor, the method comprising:
    forming a gate electrode with a layer of a first rare earth metal over a channel region of a substrate, the gate electrode providing a Schottky junction with the substrate;
    forming spacers over sidewalls of the gate electrode; and
    forming a layer of a second rare earth metal over the spacers and the substrate to produce source and drain regions in the substrate exposed on both sides of the spacers, wherein a bottom portion of the source and drain regions contacts an upper portion of a buried oxide layer,
    wherein the first rare earth metal and the second rare earth metal is selected from a group consisting of: erbium (Er), ytterbium (Yb), samarium (Sm), yttrium (Y), lanthanum (La), cerium (Ce), terbium (Tb), dysprosium (Dy), holmium (Ho), thulium (Tm), and lutetium (Lu).

11. The method of claim 1, wherein the first rare earth metal and the second rare earth metal is selected from a group consisting of: ytterbium (Yb), samarium (Sm), yttrium (Y), lanthanum (La), cerium (Ce), terbium (Tb), dysprosium (Dy), holmium (Ho), thulium (Tm), and lutetium (Lu).

* * * * *